(12) United States Patent
Slipy et al.

(10) Patent No.: US 12,339,715 B2
(45) Date of Patent: Jun. 24, 2025

(54) COMPUTING DOCK WITH ARTICULATING VENT COVER

(71) Applicant: Dell Products L.P., Round Rock, TX (US)

(72) Inventors: Michael John Slipy, Oakland Park, FL (US); James H. Hallar, Austin, TX (US); Jean Marie Doglio, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 260 days.

(21) Appl. No.: 18/303,868

(22) Filed: Apr. 20, 2023

(65) Prior Publication Data

US 2024/0353903 A1 Oct. 24, 2024

(51) Int. Cl.
   *G06F 1/20* (2006.01)
   *G06F 1/16* (2006.01)
   *H05K 7/20* (2006.01)

(52) U.S. Cl.
   CPC ............. *G06F 1/20* (2013.01); *G06F 1/1632* (2013.01); *H05K 7/20145* (2013.01); *H05K 7/20172* (2013.01)

(58) Field of Classification Search
   CPC .......... G06F 1/20; G06F 1/1632; G06F 1/203; H05K 7/20145; H05K 7/20172
   See application file for complete search history.

(56) References Cited

U.S. PATENT DOCUMENTS

| | | | | |
|---|---|---|---|---|
| 5,347,425 | A * | 9/1994 | Herron | G06F 1/1632 361/679.41 |
| 6,453,378 | B1 * | 9/2002 | Olson | G06F 1/203 361/679.55 |
| 8,000,099 | B2 * | 8/2011 | Parker | G06F 1/203 361/679.48 |
| 8,705,233 | B2 * | 4/2014 | Rehmann | G06F 1/206 361/679.48 |
| 10,416,734 | B2 * | 9/2019 | Casparian | G06F 1/1632 |
| 2011/0038121 | A1 * | 2/2011 | Tabasso | G06F 1/1632 361/679.55 |
| 2014/0043750 | A1 * | 2/2014 | Calderone | G06F 1/203 361/679.41 |
| 2014/0098486 | A1 * | 4/2014 | Davis | G06F 1/1607 361/679.41 |
| 2019/0004551 | A1 * | 1/2019 | North | G06F 1/1632 |
| 2024/0069599 | A1 * | 2/2024 | Hudson | G06F 1/1632 |
| 2024/0085950 | A1 * | 3/2024 | Xiao | G06F 13/385 |

* cited by examiner

*Primary Examiner* — Stephen S Sul
(74) *Attorney, Agent, or Firm* — McDermott Will & Emery LLP

(57) ABSTRACT

A computing device, including a body, including walls defining a perimeter surface at a first side of the body; and a first surface at the first side of the body; a vent cover coupled to the body at the first side of the body, the vent cover including a first surface; a second surface; a protrusion extending from the second surface; a switch contained within the body; wherein, when the vent cover is in a first positional state with respect to the body a first gap is defined between the second surface of the vent cover and the first surface of the body, wherein, when the vent cover is in a second positional state with respect to the body a second gap is defined between the second surface of the vent cover and the first surface of the body such that the protrusion of the vent cover engages the switch.

20 Claims, 7 Drawing Sheets

COMPUTING DOCK WITH ARTICULATING VENT COVER

BACKGROUND

Field of the Disclosure

The disclosure relates generally to a computing dock include an articulating vent cover.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Innovative aspects of the subject matter described in this specification may be embodied in a computing device, including: a body, including: a plurality of walls defining a perimeter surface at a first side of the body; and a first surface at the first side of the body; a vent cover coupled to the body at the first side of the body, the vent cover translatable with respect to the body, the vent cover including: a first surface; a second surface positioned opposite to the first surface of the vent cover; and a protrusion extending from the second surface; a switch contained within the body; wherein, when the vent cover is in a first positional state with respect to the body: a first gap having a first magnitude is defined between the second surface of the vent cover and the first surface of the body, wherein, when the vent cover is in a second positional state with respect to the body: a second gap having a second magnitude is defined between the second surface of the vent cover and the first surface of the body such that the protrusion of the vent cover engages the switch to change the switch from a first state to a second state, wherein the first magnitude is greater than the second magnitude.

Other embodiments of these aspects include corresponding systems and apparatus.

These and other embodiments may each optionally include one or more of the following features. For instance, the vent cover is pivotable with respect to the body. The vent cover is coupled to the body at the first side of the body and at a first end of the body such that the vent cover pivots about the first end of the body. When the vent cover is in the second positional state with respect to the body, the second surface of the vent cover is angled with respect to the first surface of the body. The second magnitude of the second gap is zero proximate to a second end of the body opposite to the first end of the body. The body further includes a sloped surface between the perimeter surface and the first surface of the body. The vent cover further includes a sloped surface between the first surface of the vent cover and the second surface of the vent cover, wherein the sloped surface of the vent cover corresponds to the sloped surface of the body. The body further includes a plurality of vents, the first gap is an air inlet, the computing device further includes a fan contained within the body, the fan circulating air from the air inlet to the plurality of vents. Further including a plurality of computing components contained within the body, wherein the fan circulates air from the air inlet to the plurality of vents to adjust a temperature of the computing components. The computing device is a computing dock. When the vent cover is in the first positional state with respect to the body: the first gap having the first magnitude is defined between the second surface of the vent cover and the first surface of the body such that the protrusion of the vent disengages the switch to change the switch from the second state to the first state. The first state of the switch is a pairing state.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
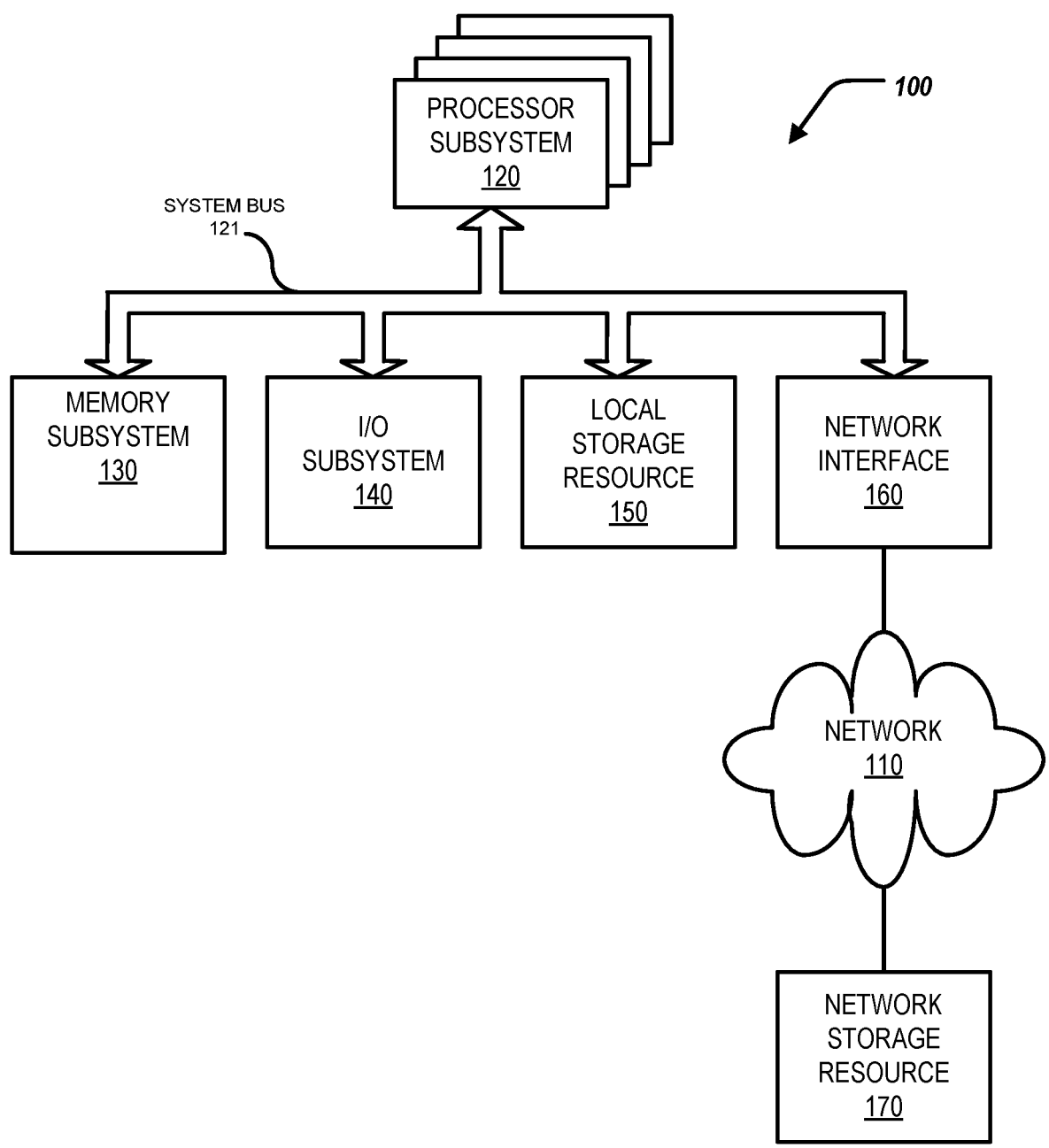
FIG. 1 is a block diagram of selected elements of an embodiment of an information handling system.

This disclosure discusses a computing dock include an articulating vent cover. In short, a computing dock can allow a vent cover of the computing dock to deflect and actuate to activate a pairing switch. An air intake gap between a body of the computing dock and the vent cover can allow the vent cover to translate to activate such pairing, described further herein.

Specifically, this disclosure discusses a computing device, including: a body, including: a plurality of walls defining a perimeter surface at a first side of the body; and a first surface at the first side of the body; a vent cover coupled to the body at the first side of the body, the vent cover translatable with respect to the body, the vent cover including: a first surface; a second surface positioned opposite to the first surface of the vent cover; and a protrusion extending from the second surface; a switch contained within the body; wherein, when the vent cover is in a first positional state with respect to the body: a first gap having a first magnitude is defined between the second surface of the vent cover and the first surface of the body, wherein, when the vent cover is in a second positional state with respect to the body: a second gap having a second magnitude is defined between the second surface of the vent cover and the first surface of the body such that the protrusion of the vent cover engages the switch to change the switch from a first state to a second state, wherein the first magnitude is greater than the second magnitude.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-6 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

The information handing system 100 can include a computing dock.

Figure 2:
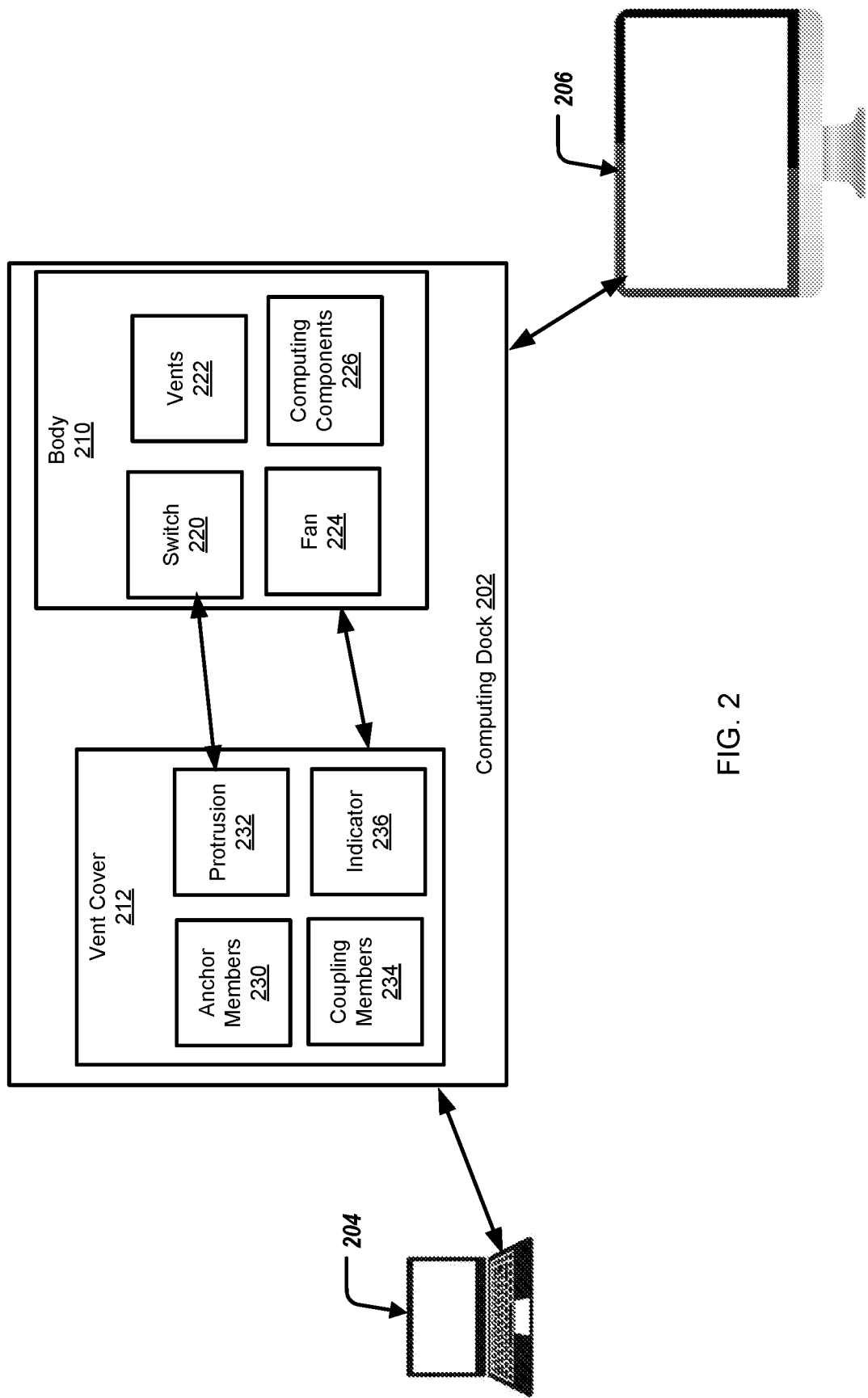
FIG. 2 illustrates a block diagram of a computing environment including a computing dock to couple an information handling system with a display device.

Turning to FIG. 2, FIG. 2 illustrates an environment 200 including a computing dock 202, a portable computing device 204, and a display device 206. The computing dock 202 can include a body 210 and a vent cover 212. In some examples, the computing dock 202 can include one or more components as described with respect to the information handling system 100 of FIG. 1.

The body 210 can include a switch 220, vents 222, a fan 224, and computing components 226. The vent cover 212 can include anchor members 230, a protrusion 232, coupling members 234, and an indicator 236.

The vent cover 212 can be coupled to the body 210, described further herein.

The computing dock 202 can be in communication with the portable computing device 204 and the display 206. In short, the computing dock 202 can facilitate communication between the portable computing device 204 and the display 206 (and/or one or more other external devices).

In short, the computing dock 202 can allow the vent cover 212 to deflect and actuate to activate a pairing switch. An air intake gap can be defined between the body 210 and the vent cover 212 to allow the vent cover 212 to translate to activate such pairing, described further herein.

Figure 3:
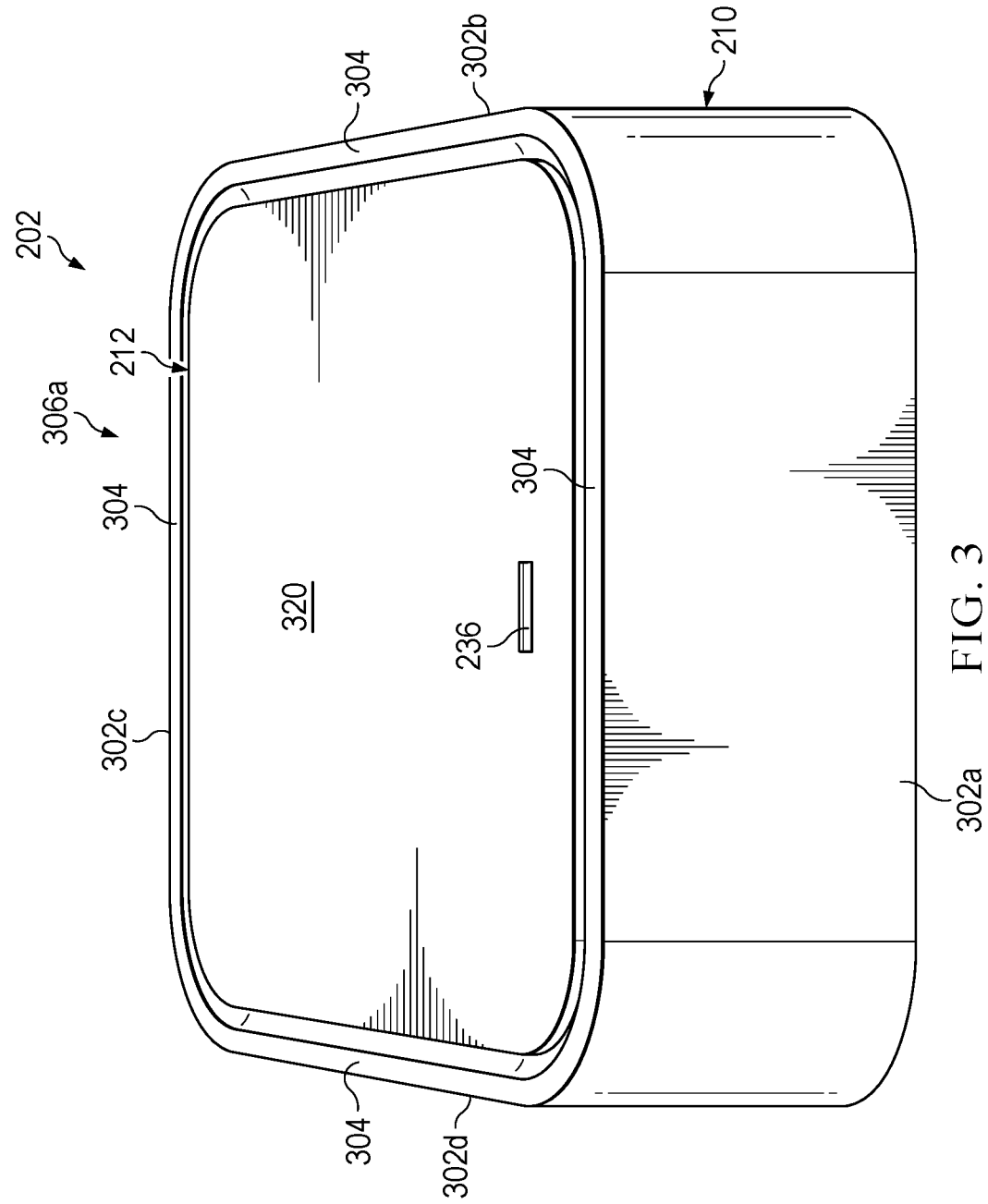
FIG. 3 is a perspective view of the computing dock.
Figure 4:
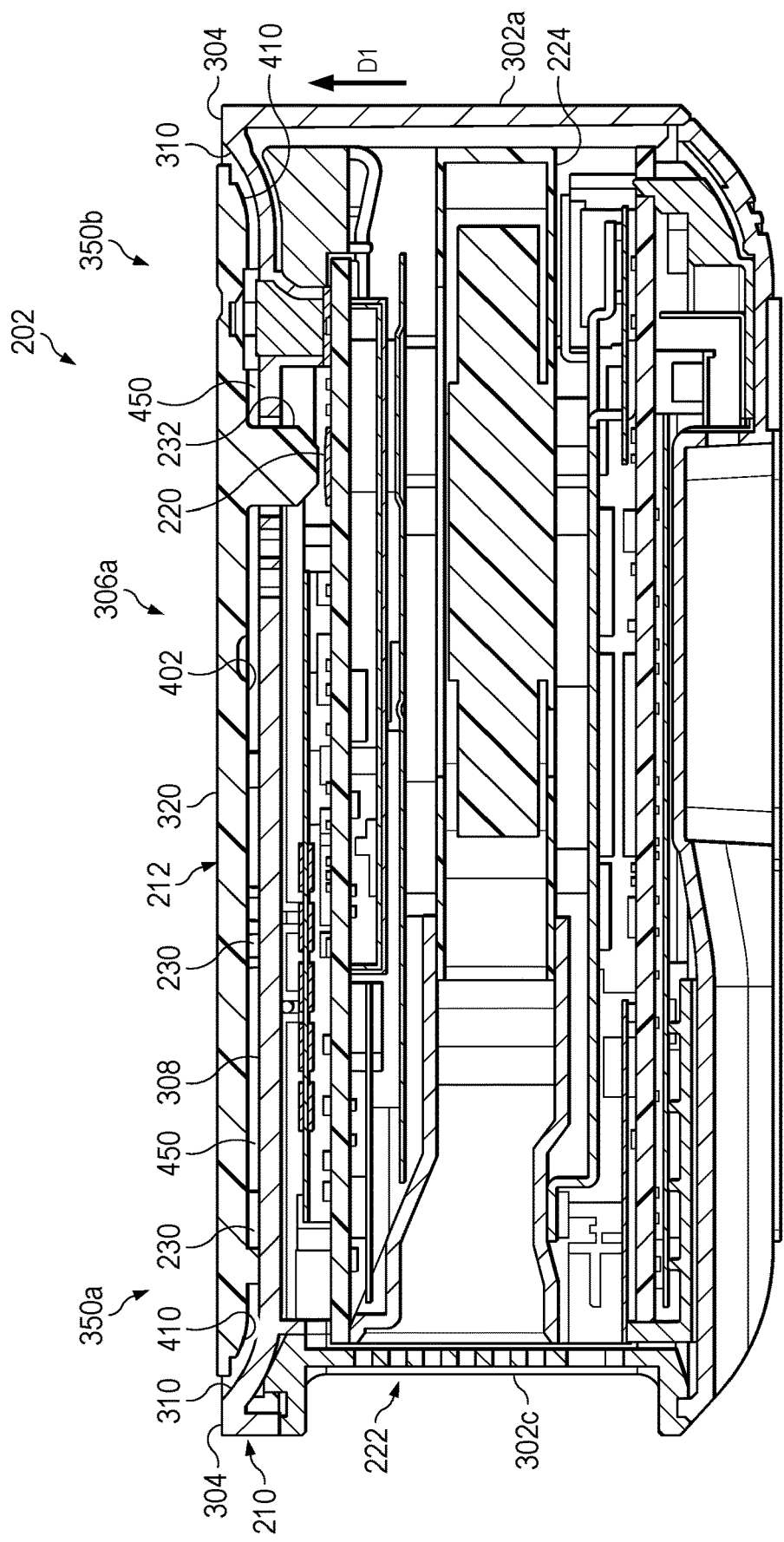
FIG. 4 is a cut-away side view of the computing dock, in a first state.

FIG. 3 illustrates a perspective view of the computing dock 202. FIG. 4 illustrates a cut-away side view of the computing dock 202.

Referring to FIGS. 3 and 4, the computing dock 202 can include the body 210 and the vent cover 212. The body 210 can include a plurality of walls 302a, 302b, 302c, 302d (collectively referred to as walls 302). The walls 302 can define a perimeter surface 304 at a first side 306a of the body 210. The body 210 can further include a first surface 308 at the first side 306a of the body 210. The body 210 can further include a sloped surface 310 between the perimeter surface 304 and the first surface 308. The body 210 can further include the plurality of vents 222. For example, the vents 222 can be along the wall 302c; however, the vents 312 can be positioned on one or more of the walls 302. The fan 224 can be contained within the body 210.

Figure 5A:
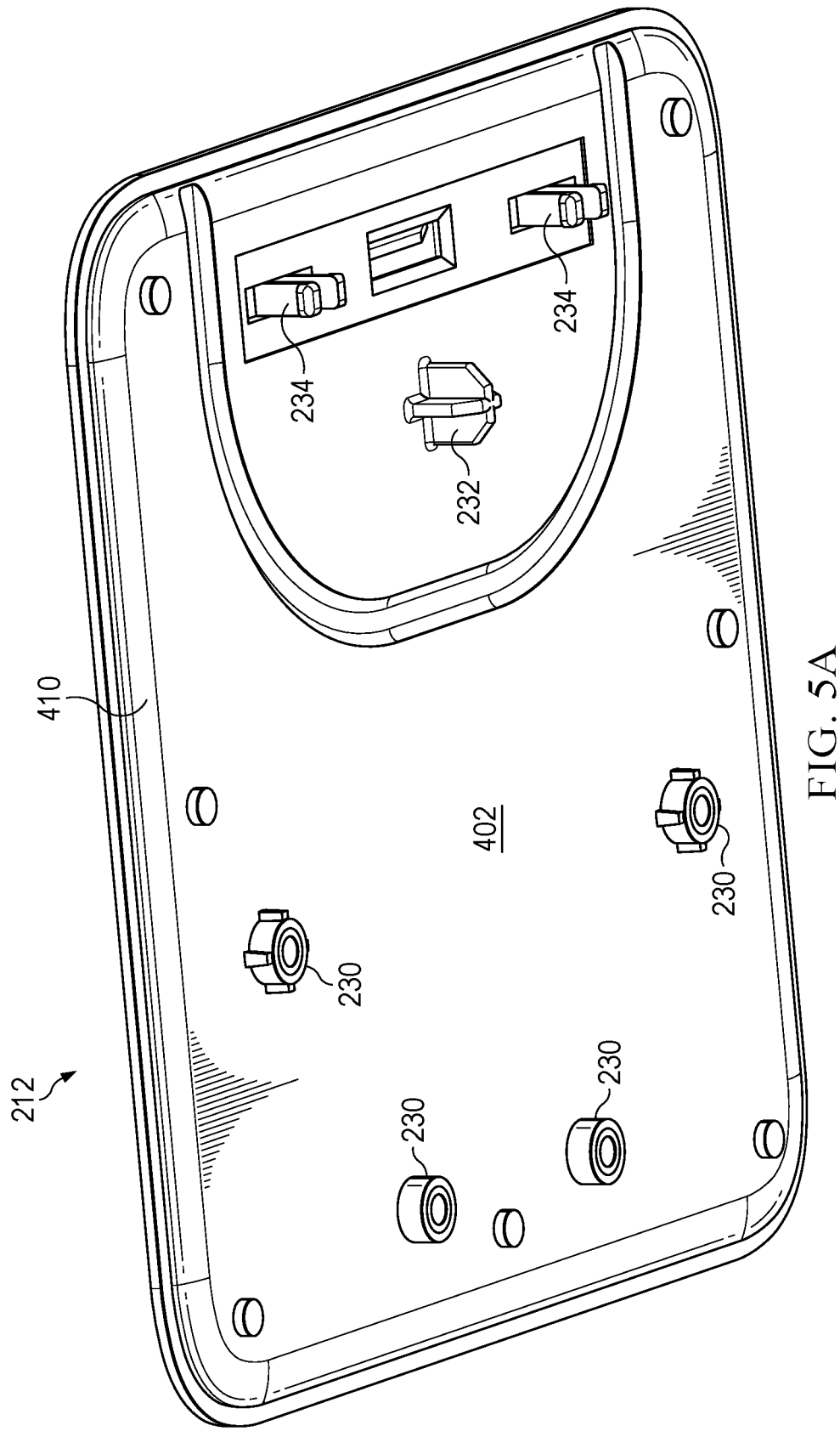
FIG. 5A is a bottom up perspective view of a vent cover of the computing dock.
Figure 5B:
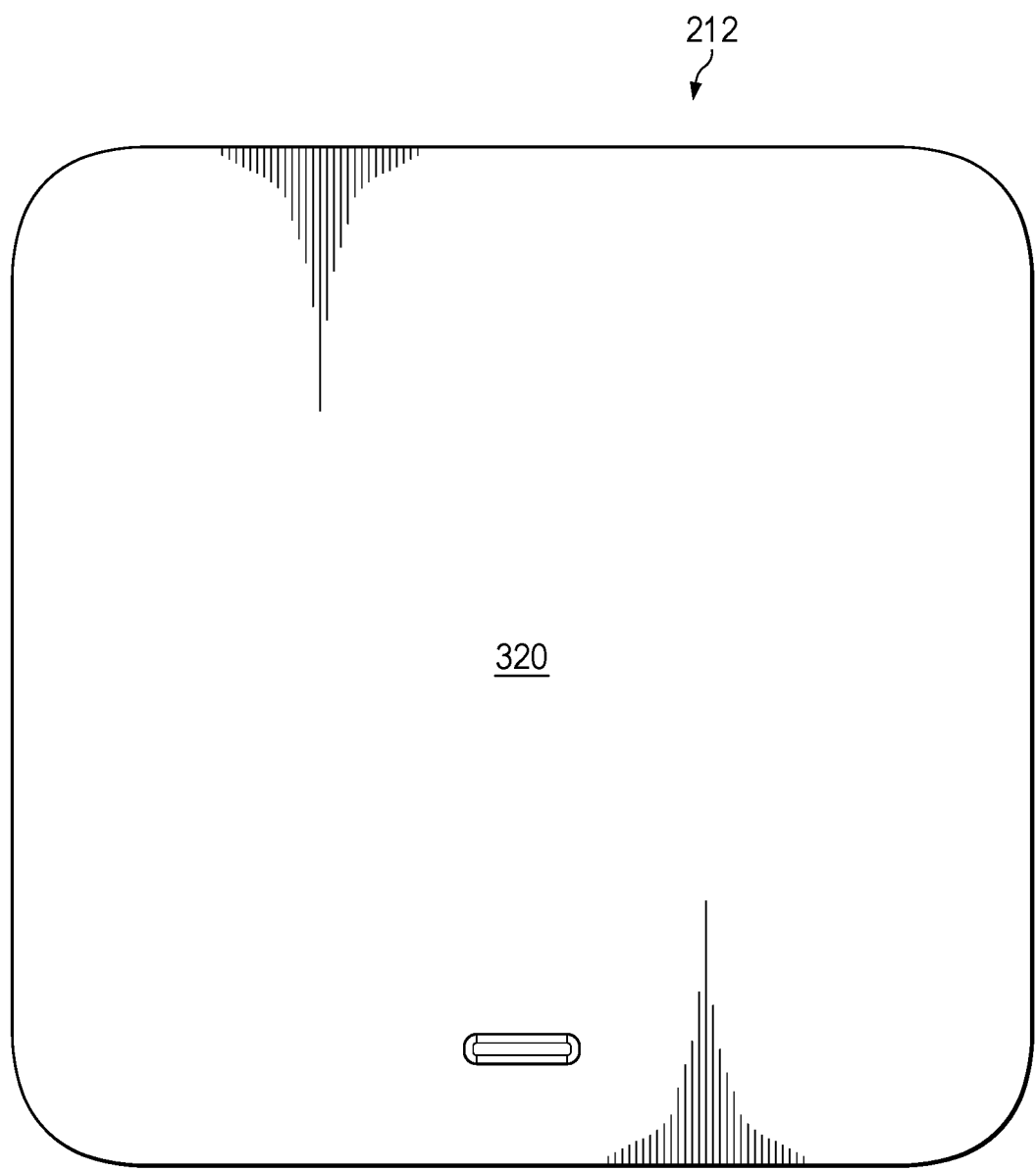
FIG. 5B is a top down perspective view of the vent cover of the computing dock.

FIG. 5A illustrates a bottom up perspective view of the vent cover 212; and FIG. 5B illustrates a top down perspective view of the vent cover 212. Referring to FIGS. 3, 4, 5A, 5B, the vent cover 212 is coupled to the body 210 at the first side 306a of the body 210. In particular, the vent cover 212 is coupled to the body 210 at the first side 306a of the body 210 and a first end 350a of the body 210. The vent cover 212 is translatable with respect to the body 210, described further herein. The vent cover 212 includes a first surface 320 and a second surface 402 positioned opposite to the first surface 320. The vent cover 212 can further include the protrusion 232 extending from the second surface 402. The vent cover 212 can include the anchor members 230 and the coupling members 234. The vent cover 212 can be coupled to the body 210 via the anchor members 230. The coupling members 234 prevent articulation of the vent cover 212 in the direction D1 beyond a static resting position of the vent cover 212 with respect to the body 210.

In some examples, the vent cover 212 is coupled to the body 210 at the first side 306a of the body 210 and a first end 350a of the body 210. Furthermore, in some examples, the vent cover 212 is pivotable with respect to the body 210. That is, the vent cover 212 pivots about the first end 350a of the body 210. In particular, the vent cover 212 pivots about the anchor members 230 at the first end 350a of the body 210.

The vent cover 212 can further include a sloped surface 410 between the first surface 320 of the vent cover 212 and the second surface 402 of the vent cover 212. The sloped surface 410 of the vent cover 212 can correspond to the sloped surface 310 of the body 210.

Referring to FIG. 4, the switch 220 is contained within the body 210.

To that end, FIG. 4 illustrates the vent cover 212 in a first positional state with respect to the body 210. Specifically, when the vent cover 212 is in the first positional state with respect to the body 210, a first gap 450 is defined between the second surface 402 of the vent cover 212 and the first surface 308 of the body 210. The first gap 450 can have a first magnitude. For example, the first magnitude of the first gap 450 can be approximately 1.2 millimeters. In some examples, the first gap 450 is substantially constant between the second surface 402 of the vent cover 212 and the first surface 308 of the body 210.

In some examples, the first gap 450 is an air inlet. To that end, the fan 224 can circulate air from the first gap 450 (as an air inlet) to the plurality of vents 222. Thus, when the fan 224 circulates air from the first gap 450 (as an air inlet) to the plurality of vents 222, the fan 224 circulates air over the computing components 226 to adjust a temperature of the computing components 226 (e.g., provide air-cooling to the computing components 226).

When the vent cover 212 is in the first positional state with respect to the body 210, the protrusion 232 of the vent cover 212 is disengaged from contact with the switch 220. In particular, when the protrusion 232 of the vent cover 212 is disengaged from contact with the switch 220, the switch 220 is in a first state. The first state of the switch 220 can include a non-pairing state of the switch 220.

Figure 6:
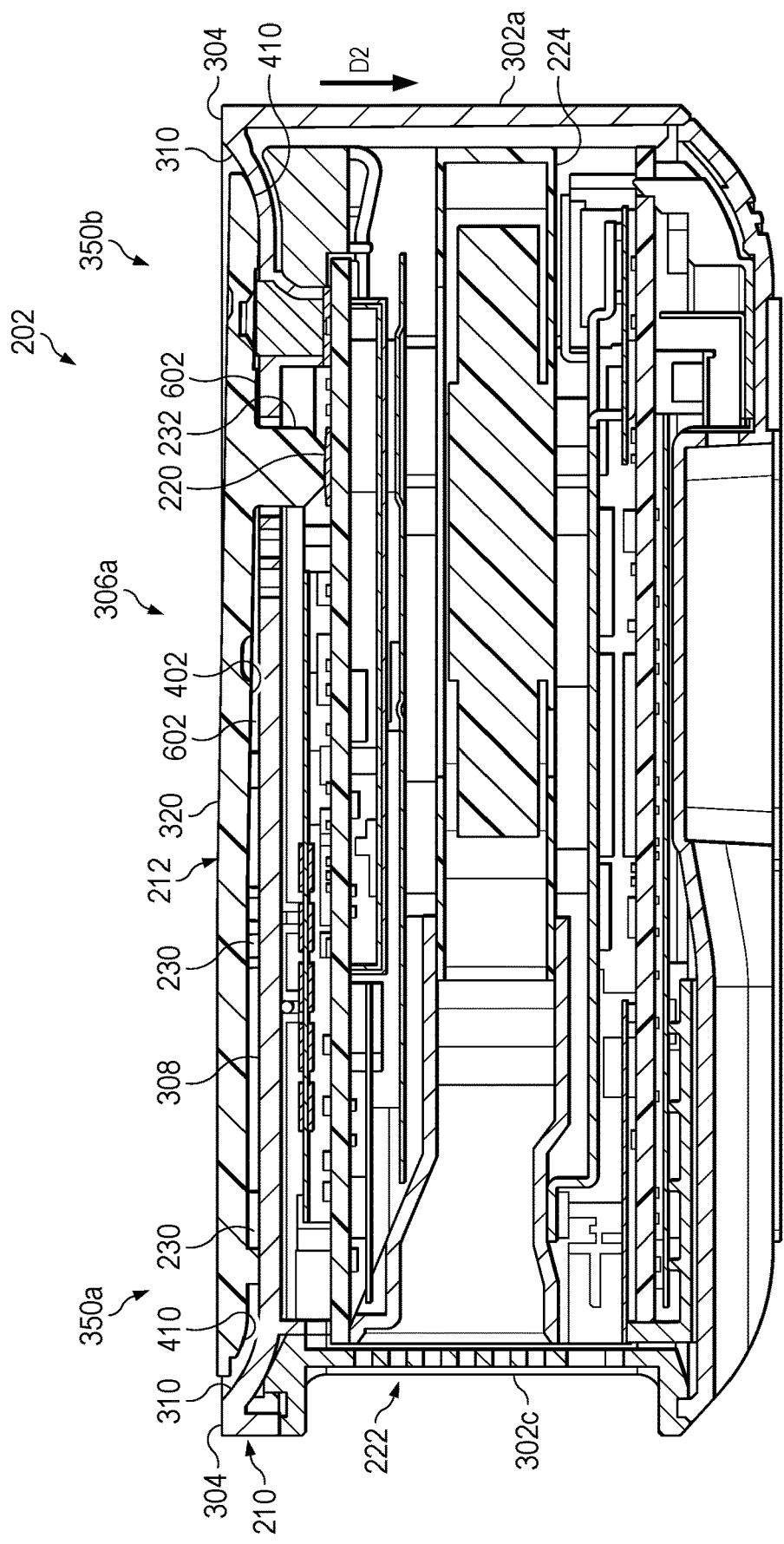
FIG. 6 is a cut-away side view of the computing dock, in a second state.

FIG. 6 illustrate the vent cover 212 is a second positional state with respect to the body 210. For example, a user can "press" the vent cover 212 (i.e., exert a force on the vent cover 212) to transition the vent cover 212 from the first positional state to the second positional state with respect to the body 210 (e.g., along direction D2)

Specifically, when the vent cover 212 is in the second positional state with respect to the body 210, a second gap 602 is defined between the second surface 402 of the vent cover 212 and the first surface 308 of the body 210. The second gap 602 can have a second magnitude. The first magnitude of the first gap 450 can be greater than the second magnitude of the second gap 602.

When the vent cover 212 is in the second positional state with respect to the body 210, the protrusion 232 of the vent cover 212 engages the switch 220. In particular, when the protrusion 232 of the vent cover 212 engages with the switch 220 (the protrusion 232 contacts and actuates the switch 220), the switch 220 is changed from the first state to a second state. The second state of the switch 220 can include a pairing state (e.g., for coupling of an external device such as a keyboard or mouse with the computing dock 202).

In some examples, when the vent cover 212 is in the second positional state with respect to the body 210, the second surface 402 of the vent cover 212 is angled with respect to the first surface 308 of the body 210. That is, the vent cover 212 is pitched with respect to the body 210. In some examples, the vent cover 212 is pitched (or angled) with respect to the body 210 such that an angle is formed between the second surface 402 of the vent cover 212 and the first surface 308 of the body 210. For example, the magnitude of the second gap 602 at the first end 350a of the body 210 is greater than the magnitude of the second gap 650 at a second end 350b of the body 210 (the second end 350b opposite to the first end 350a). For example, the magnitude of the second gap 602 at the second end 350b of the body 210 is approximately zero.

When the vent cover 212 is transitioned from the first positional state to the second positional state, the first gap 450 transitions to the second gap 602 reducing a magnitude of the air inlet of the gap. However, such transition is momentary (e.g., a user "pressing" the vent cover 212) and has no impact on cooling of the computing components 226.

Referring back to FIG. 4, the vent cover 212 can transition from the second positional state to the first positional state with respect to the body 210. For example, a user can "release" the vent cover 212 (i.e., cease to exert a force on the vent cover 212) to transition the vent cover 212 from the second positional state to the first positional state with respect to the body 210.

When the vent cover 212 transitions to the first positional state with respect to the body 210, the protrusion 232 of the vent cover 212 disengages from contact with the switch 220. In particular, when the protrusion 232 of the vent cover 212 is disengaged from contact with the switch 220, the switch 220 transitions from the second state back to the first state.

In some examples, the vent cover 212 transitions from the second positional state to the first positional state with respect to the body 210 (e.g., when the user "releases" the vent cover 212) by elastic properties of the vent cover 212. For example, the vent cover 212 can be formed from plastic as the physical return mechanism.

Referring back to FIG. 3, the indicator 236 can include a light indicating the status of the switch 220. That is, the indicator 236 can indicate the pairing state of the computing dock 202. That is, the indicator 236 can indicate whether the switch 220 is engaged or disengaged. Furthermore, the indicator 236 can indicate further states of the pairing between the computing dock 202 and one or more external devices, such as a keyboard or a mouse. The indicator 236 can further be associated with one or more colors to indicate such pairing state, and a blinking rate of the indicators 236 can further indicate pairing states. For example, the indicator 236 can indicate: i) not connected, ii) connected/paired, iii) pairing, iv) reconnect, v) manual disconnect, vi) error state, vii) serious error state, viii) workstation available, and ix) workstation reserved.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A computing device, including:
    a body, including:
        a plurality of walls defining a perimeter surface at a first side of the body; and
        a first surface at the first side of the body;
    a vent cover coupled to the body at the first side of the body, the vent cover translatable with respect to the body, the vent cover including:
        a first surface;
        a second surface positioned opposite to the first surface of the vent cover; and
        a protrusion extending from the second surface;
    a switch contained within the body;
    wherein, when the vent cover is in a first positional state with respect to the body:
        a first gap having a first magnitude is defined between the second surface of the vent cover and the first surface of the body,
    wherein, when the vent cover is in a second positional state with respect to the body:
        a second gap having a second magnitude is defined between the second surface of the vent cover and the first surface of the body such that the protrusion of the vent cover engages the switch to change the switch from a first state to a second state, wherein the first magnitude is greater than the second magnitude.

2. The computing device of claim 1, wherein the vent cover is pivotable with respect to the body.

3. The computing device of claim 2, wherein the vent cover is coupled to the body at the first side of the body and at a first end of the body such that the vent cover pivots about the first end of the body.

4. The computing device of claim 3, wherein when the vent cover is in the second positional state with respect to the body, the second surface of the vent cover is angled with respect to the first surface of the body.

5. The computing device of claim 4, wherein the second magnitude of the second gap is zero proximate to a second end of the body opposite to the first end of the body.

6. The computing device of claim 1, wherein the body further includes a sloped surface between the perimeter surface and the first surface of the body.

7. The computing device of claim 6, wherein the vent cover further includes a sloped surface between the first surface of the vent cover and the second surface of the vent cover, wherein the sloped surface of the vent cover corresponds to the sloped surface of the body.

8. The computing device of claim 1, wherein
    the body further includes a plurality of vents,
    the first gap is an air inlet,
    the computing device further includes a fan contained within the body, the fan circulating air from the air inlet to the plurality of vents.

9. The computing device of claim 8, further including a plurality of computing components contained within the body, wherein the fan circulates the air from the air inlet to the plurality of vents to adjust a temperature of the plurality of computing components.

10. The computing device of claim 1, wherein the computing device is a computing dock.

11. The computing device of claim 1, wherein when the vent cover is in the first positional state with respect to the body:
    the first gap having the first magnitude is defined between the second surface of the vent cover and the first surface of the body such that the protrusion of the vent disengages the switch to change the switch from the second state to the first state.

12. The computing device of claim 1, wherein the first state of the switch is a pairing state.

13. A computing dock, comprising:
    a body having a first end and a second end, the second end opposite to the first end, the body including:
        a plurality of walls defining a perimeter surface at a first side of the body; and
        a first surface at the first side of the body;
    a vent cover coupled to the body at the first side of the body and the first end of the body, the vent cover pivotable above the first end of the body, the vent cover including:
        a first surface;
        a second surface positioned opposite to the first surface of the vent cover; and
        a protrusion extending from the second surface;
    a switch contained within the body;
    wherein, when the vent cover is in a first positional state with respect to the body:
        a first gap having a first magnitude is defined between the second surface of the vent cover and the first surface of the body;
    wherein, when the vent cover is in a second positional state with respect to the body:
        a second gap having a second magnitude is defined between the second surface of the vent cover and the first surface of the body such that the vent cover is angled with respect to the first surface of the body and the protrusion of the vent cover engages the switch to change the switch from a first state to a second state, wherein the first magnitude is greater than the second magnitude.

14. The computing dock of claim 13, wherein the second magnitude of the second gap is zero proximate to the second end of the body opposite to the first end of the body.

15. The computing dock of claim 13, wherein the body further includes a sloped surface between the perimeter surface and the first surface of the body.

16. The computing dock of claim 15, wherein the vent cover further includes a sloped surface between the first surface of the vent cover and the second surface of the vent cover, wherein the sloped surface of the vent cover corresponds to the sloped surface of the body.

17. The computing dock of claim 13, wherein
    the body further includes a plurality of vents,
    the first gap is an air inlet,
    the computing dock further includes a fan contained within the body, the fan circulating air from the air inlet to the plurality of vents.

18. The computing dock of claim 17, further including a plurality of computing components contained within the body, wherein the fan circulates the air from the air inlet to the plurality of vents to adjust a temperature of the plurality of computing components.

19. The computing dock of claim 13, wherein when the vent cover is in the first positional state with respect to the body:
 the first gap having the first magnitude is defined between the second surface of the vent cover and the first surface of the body such that the protrusion of the vent disengages the switch to change the switch from the second state to the first state.

20. The computing dock of claim 13, wherein the first state of the switch is a pairing state.

* * * * *